US006946777B2

(12) United States Patent
Owen

(10) Patent No.: US 6,946,777 B2
(45) Date of Patent: Sep. 20, 2005

(54) POLYMER FILM COMPOSITE TRANSDUCER

(75) Inventor: Thomas E. Owen, Helotes, TX (US)

(73) Assignees: Southwest Research Institute, San Antonio, TX (US); Gas Research Institute, Des Plaines, IL (US)

( * ) Notice: Subject to any disclaimer, the term of this patent is extended or adjusted under 35 U.S.C. 154(b) by 0 days.

(21) Appl. No.: 10/753,613

(22) Filed: Jan. 8, 2004

(65) Prior Publication Data

US 2004/0201331 A1 Oct. 14, 2004

Related U.S. Application Data

(60) Provisional application No. 60/439,111, filed on Jan. 10, 2003.

(51) Int. Cl.$^7$ .......... H01L 41/08

(52) U.S. Cl. .......... 310/334; 310/800

(58) Field of Search .......... 310/322, 334–337, 310/800

(56) References Cited

U.S. PATENT DOCUMENTS

| | | | | | |
|---|---|---|---|---|---|
| 4,330,730 | A | * | 5/1982 | Kurz et al. | 310/331 |
| 4,435,667 | A | * | 3/1984 | Kolm et al. | 310/367 |
| 5,153,859 | A | * | 10/1992 | Chatigny et al. | 367/140 |
| 5,321,332 | A | * | 6/1994 | Toda | 310/322 |
| 5,438,553 | A | * | 8/1995 | Wilson et al. | 367/140 |
| 5,559,387 | A | * | 9/1996 | Beurrier | 310/328 |
| 6,437,489 | B1 | * | 8/2002 | Shinke et al. | 310/369 |

* cited by examiner

*Primary Examiner*—Mark Budd
(74) *Attorney, Agent, or Firm*—Baker Botts L.L.P.

(57) ABSTRACT

A composite piezoelectric transducer, whose piezoeletric element is a “ribbon wound” film of piezolectric material. As the film is excited, it expands and contracts, which results in expansion and contraction of the diameter of the entire ribbon winding. This is accompanied by expansion and contraction of the thickness of the ribbon winding, such that the sound radiating plate may be placed on the side of the winding.

6 Claims, 1 Drawing Sheet

POLYMER FILM COMPOSITE TRANSDUCER

RELATED PATENT APPLICATION

This application claims the benefit of U.S. Provisional Application No. 60/439,111, filed Jan. 10, 2003 and entitled "POLYMER FILM COMPOSITE TRANSDUCER".

GOVERNMENT RIGHTS CLAUSE

The U.S. Government has a paid-up license in this invention and the right in certain circumstances to require the patent owner to license others on reasonable terms as provided for by the terms of Contract No. DE-FC21-96MC33033 for the U.S. Department of Energy.

TECHNICAL FIELD OF THE INVENTION

This invention relates to piezoelectric transducers, and more particularly to a composite piezoelectric polymer film transducer.

BACKGROUND OF THE INVENTION

Composite piezoelectric transducers are recognized for their improved performance characteristics in acoustic and ultrasonic applications that require wide bandwidth and high sensitivity. In particular, composite transducer technology can provide significantly higher effective piezoelectric material coefficients than are available in conventional piezoceramic materials. Inherent advantages associated with composite transducer devices include lower acoustical impedence and higher coupling efficiency in the sound propagation medium, specifically, in water, air, and other gaseous media.

One form of piezoelectric composite transducer consists of piezoelectric rods, tubes, or rectangular bars oriented parallel to one another but spaced apart so as to be surrounded and bounded together by an epoxy matrix filler. This composite arrangement may be formed in the shape of a square or rectangular plate or a circular disk whose sound-radiating face is the surface of the plate or disk. The embedded piezoceramic elements are oriented perpendicular to the sound radiating face.

Another form of composite piezoelectric transducer is comprised of piezoceramic plates having a rectangular shape arranged parallel to one another but separated by epoxy bonding layers. This laminated composite array of piezoceramic plates and epoxy layers forms a square or rectangular plate whose sound-radiating face is the surface of the plate. The edges of the piezoceramic plates are oriented perpendicular to the sound-radiating face.

In the first described composite transducer, the cross-axis polarization piezoelectric coefficients of the piezoceramic material govern the acoustical operation. The piezoceramic rods are usually polarized along their length axis (oriented perpendicular to the radiating face). Improved performance characteristics are achieved by the lateral volume expansion and contraction of the piezoceramic elements acting on the surrounding epoxy matrix, giving rise to displacements and sound radiation normal to the face.

In the second described composite transducer, the plates are usually polarized in their thickness dimension (oriented parallel to the radiating face). Their parallel polarization piezoelectric coefficient governs the acoustical operation by applying lateral volume expansion and contraction to the surrounding epoxy matrix. This results in displacements and sound radiation normal to the face of the plate.

SUMMARY OF THE INVENTION

The following invention is directed to a composite piezoelectric film transducer for efficient acoustic coupling in air and other gas media. It is capable of providing wide bandwidth and high sensitivity in the sonic and ultrasonic frequency ranges.

An example of an application for the transducer is for precision quantitative measurement of diluent gases, such as nitrogen and carbon dioxide, in natural gas mixtures. It may be further used to accurately measure the speed of sound in such gas mixtures.

DETAILED DESCRIPTION OF THE INVENTION

Figure 1:
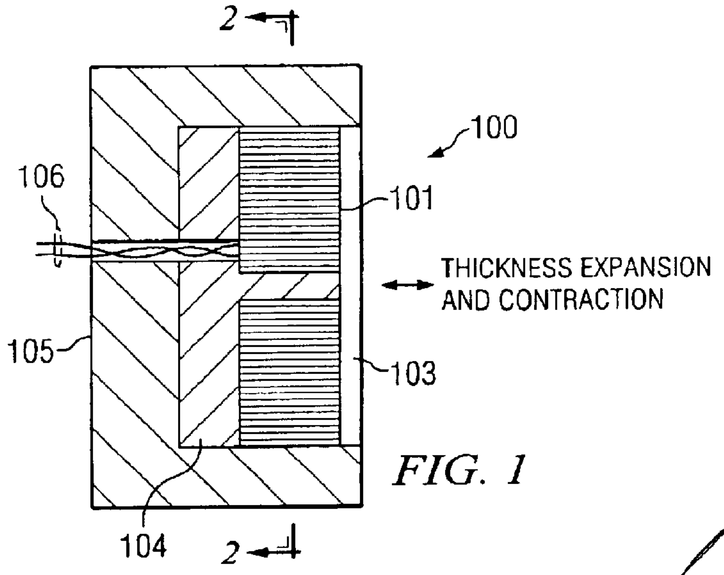
FIG. 1 is a side cross sectional view of a transducer in accordance with the invention.
Figure 2:
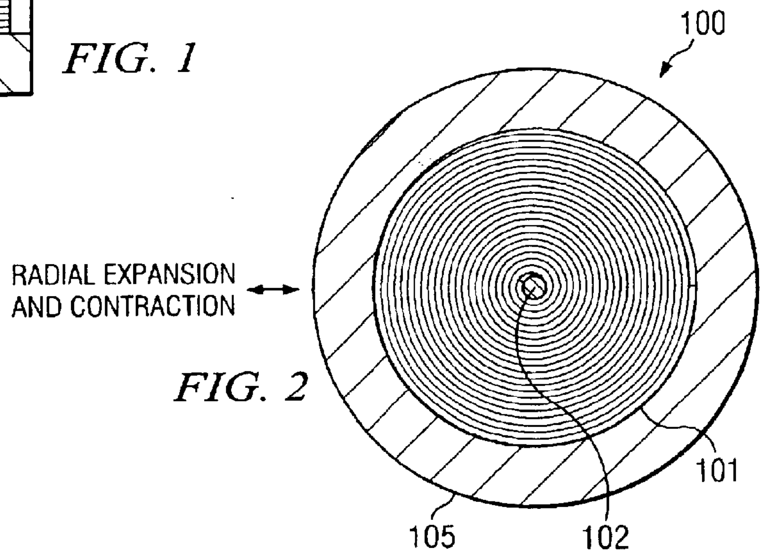
FIG. 2 is front cross sectional view of the transducer of FIG. 1.

FIGS. 1 and 2 illustrate a composite piezoelectric transducer 100 in accordance with the invention. FIG. 1 is a side cross sectional view and FIG. 2 is a cross sectional view along line 2—2 of FIG. 1. As explained below, transducer 100 uses a piezoelectric polymer film material rather than piezoceramic material to form its piezoelectric element 101. The film is very thin and flexible and the piezoelectric element 101 is formed as a continuous length ribbon wound on a mandrel 102. Thus, the piezoelectric element 101 of transducer 100 may be described as a "ribbon wound" piezoelectric element.

Figure 3:
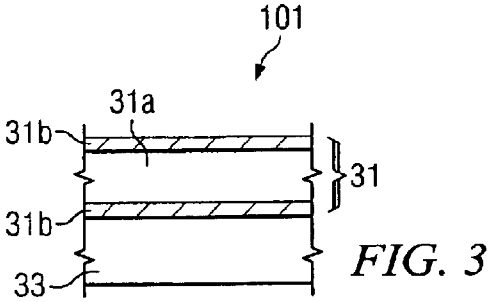
FIG. 3 illustrates a first embodiment of the ribbon wound piezoelectric element of FIGS. 1 and 2.

FIG. 3 is a cross sectional view of a first embodiment of the ribbon-wound piezoelectric element 101. In this embodiment, piezoelectric film 31 comprises a flexible polymer layer 31*a* with a flexible conductive layer 31*b* on each face. Typically, the conductive facing 31*b* is made from aluminum. Film 31, if activated by appropriate voltages applied to conductive layers 31*b*, expands and contracts in thickness in proportion to the applied voltage.

Film 31 is backed by a layer 33 of thin inert insulating material, such as a plastic. Specifically, an elastomer material could be used for layer 33. An example of a suitable material for layer 33 is a soft silicon rubber material such as Sylgard 182 ™ material.

As this multi-layered ribbon is wound, it builds up a multi-layer structure with an insulating layer 33 between the active layers of piezolectric film 31. The layered structure comprising ribbon-wound piezoelectric element 101 is analogous to the rectangular plate configuration described in the Background. However, it contains many more layers of piezoelectric and elastomer material. Also, the electroded surfaces 31*b* of film 31 are continuous, thereby requiring electrical connections at only two points on piezoelectric element 101.

Film layer 31*a* can be any one of various piezoelectric polymer film materials, such as polyvinylidene difluoride, often referred to as PVF2 or PVDF. The use of these materials has the effect of significantly reducing the elastic moduli of the active material, as compared with that of composite transducers using ceramic materials. The result is improved acoustic impedance matching into liquid or gaseous sound propagation media. With improved impedance matching, the self-resonance effects within the transducer structure are also damped, thereby providing wider bandwidth than that obtained with piezoceramic composite transducers.

Figure 4:
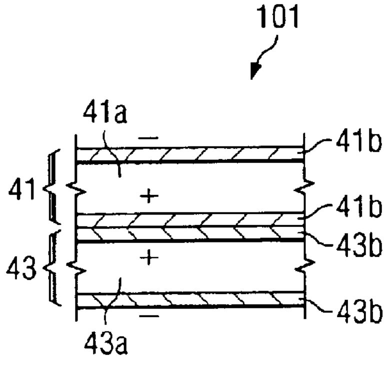
FIG. 4 illustrates a second embodiment of the ribbon wound piezoelectric element of FIGS. 1 and 2.

FIG. 4 illustrates an alternative embodiment of ribbon-wound piezoelectric element 101. In FIG. 4, element 101 is made from two layers of piezoelectric film 41 and 43. Like the film 31 of FIG. 3, films 41 and 43 have a conductive layer on each face, with inner layers 41*a* and 43*b* of piezoelectric polymer. Thus, film 41 has conductive facings 41*b* and film 43 has facings 43*b*. One film 41 is laid on top of the other 43. The facings 41*b* and 43*b* between films 41 and 43 have the same polarity, which in the example of FIG. 4, is positive. By exciting the two-ply "back-to-back" structure in electrical parallel, their mechanical forces and displacement add in series. Because the outer electrode surfaces of this two ply layer are at the same potential, they may be wrapped together without concern for electrical insulation.

Referring again to FIGS. 1 and 2, piezoelectric element 101 has an acoustical face plate 103 which is the surface that receives or transmits acoustic waves. Plate 103 is made from a material having low acoustic impedance matching characteristics. Piezoelectric element 101 is backed by a back plate 104, whose construction may be integrated with that of mandrel 102. An example of a suitable material for back plate 104 and mandrel 102 is silicon nitrile. A high rigidity epoxy bond may be used to bond piezoelectric element 101 to back plate 104. The entire assembly is housed in an aluminum case 105, which has access for electrical leads 106.

Once the film comprising piezoelectric element 101 is wound, its expansion and contraction results in expansion and contraction of the diameter of element 101. However, this radial expansion and contraction of element 101 also results in decrease and increase in the thickness of element 101. In other words, element 101 maintains a constant volume as it expands and contracts. Referring to FIGS. 1 and 2, the radial expansion and contraction indicated by the arrow in FIG. 2 is accompanied by thickness expansion and contraction indicated by the arrow in FIG. 1.

Because of the expansion and contraction of piezoelectric element 101, transducer 100 has a "thickness" mode resonance associated with the thickness dimension of the sound-radiating plate 103. This dimension corresponds to the width of the film 32. The fundamental resonance of transducer 100 will occur when the width of the film 32 is one-half the wavelength in the composite material. Because the compressional wave velocities in layer 31 and layer 33 are approximately 2,200 meters per second and 1,100 meters per second, respectively, the effective velocity in the composite may be assumed to be approximately the mean value, 1,650 meters per second (65,000 inches per second). Thus, the fundamental resonance frequency of transducer 100 is:

$$f_{resonance} = \frac{65{,}000 \text{ inches per second}}{2 * w_{ribbon} \text{ inches}} \text{Hz},$$

where w is the width of the ribbon. A transducer 100 having a ribbon width of 1 inch will have a resonance frequency of 32.5 kHz. A transducer 100 having a ribbon width of 0.1 inch will have a resonance frequency of 325 kHz. The transducer Q at resonance is:

$$Q_{resonance} = \frac{Bandwidth \text{ (Hz)}}{f_{resonance} \text{ (Hz)}}$$

which, for an estimated value of $Q_{resonance}=1$, the bandwidth of the transducer will be equal to the resonance frequency. That is, the half-power frequency response of the 1 inch ribbon transducer will be 16,250 to 48,750 Hz and that of the 0.1 inch ribbon transducer will be 162.5 to 487.5 kHz.

If transducer 100 is firmly bonded onto a rigid backing 104, such as a disk of silicon nitride ceramic, the resonance frequency expressed in the above equation will be halved and the resulting transducer Q will be slightly increased. Transducer 100 has a wide bandwidth and is capable of accurately producing sound wave signals that closely correspond to the electrical excitation waveforms applied to the terminals of transducer 100, including fast rise time pulses and broad bandwidth frequency-sweep signals.

What is claimed is:

1. A composite piezoelectric ultrasonic transducer, comprising:

a ribbon-wound piezoelectric element having a winding of a piezoelectric film ribbon against an elastomer material;

wherein the piezoelectric film ribbon has three layers: two outer conductive layers and an inner polymer layer;

wherein the elastomer material is a material having a lower modulus of elasticity than that of the polymer layer, and forms an elastic layer between the conductive layers as the film ribbon is wound, and wherein a material property of the elastomer is such that the velocity of an acoustic wave through the elastic layer is substantially lower than through the film ribbon;

wherein the winding has width selected such that the resonant frequency is an ultrasonic frequency, said width being calculated substantially as an average of the velocity of sound through the film ribbon and the elastomer material divided by four times the ultrasonic frequency;

a face plate covering the top surface or bottom surface of the winding, the face plate operable for low impedance matching of ultrasonic wave detection or generation between the winding and the environment external to the transducer; and a rigid backing on the surface of the winding opposing the face plate, operable to confine radiation and detection of ultrasonic waves to the face plate.

2. The transducer of claim 1, wherein the conductive layers are a metalized film.

3. The transducer of claim 1, wherein the inner piezoelectric polymer film layer is made from a polyvinylidene diflouride material.

4. The transducer of claim 1, further comprising a metal housing for enclosing all elements except the surface of the face plate.

5. The transducer of claim 1, wherein the velocity of ultrasonic waves through the elastomer material is equal to or less than one half the velocity of ultrasonic waves through the film ribbon.

6. The transducer of claim 1, wherein the backing is made from a ceramic material.

* * * * *